United States Patent
Kang et al.

(10) Patent No.: US 7,352,605 B2
(45) Date of Patent: Apr. 1, 2008

(54) NONVOLATILE FERROELECTRIC MEMORY DEVICE AND METHOD THEREOF

(75) Inventors: Hee Bok Kang, Cheongju-si (KR); Jin Hong Ahn, Anyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/482,128

(22) Filed: Jul. 7, 2006

(65) Prior Publication Data
US 2007/0090413 A1    Apr. 26, 2007

(30) Foreign Application Priority Data
Oct. 24, 2005    (KR) ................ 10-2005-0100218

(51) Int. Cl.
*G11C 11/22* (2006.01)
(52) U.S. Cl. .................................. 365/145; 365/148
(58) Field of Classification Search ............... 365/145, 365/148
See application file for complete search history.

(56) References Cited

U.S. PATENT DOCUMENTS

| | | | | |
|---|---|---|---|---|
| 5,088,060 | A * | 2/1992 | Endoh et al. | 365/185.17 |
| 6,091,636 | A * | 7/2000 | Liu et al. | 365/185.19 |
| 6,882,008 | B1 * | 4/2005 | Ohsawa | 257/347 |
| 2001/0045595 | A1 * | 11/2001 | Black et al. | 257/316 |
| 2004/0120188 | A1 * | 6/2004 | Chih | 365/185.18 |
| 2004/0145939 | A1 * | 7/2004 | Yoshida et al. | 365/145 |
| 2005/0002235 | A1 * | 1/2005 | Kaneda | 365/185.14 |
| 2005/0135143 | A1 * | 6/2005 | Jeon | 365/145 |
| 2006/0008983 | A1 * | 1/2006 | Yeh | 438/257 |
| 2006/0098490 | A1 * | 5/2006 | Mori | 365/185.22 |
| 2006/0238310 | A1 * | 10/2006 | Kang et al. | 340/10.51 |
| 2006/0274569 | A1 * | 12/2006 | Joshi et al. | 365/154 |

FOREIGN PATENT DOCUMENTS

| | | |
|---|---|---|
| JP | 2002016255 | 1/2002 |
| KR | 10-0340880 | 6/2002 |

OTHER PUBLICATIONS

Notice of Rejection from the Korean Intellectual Property Office, dated Nov. 20, 2006, in counterpart Korean Patent Application No. 10-2005-0100218.

* cited by examiner

*Primary Examiner*—Michael T Tran
(74) *Attorney, Agent, or Firm*—Finnegan, Henderson, Farabow, Garrett & Dunner, L.L.P.

(57) ABSTRACT

A nonvolatile ferroelectric memory device has a plurality of ferroelectric memory cells. The ferroelectric memory cells include a first double gate cell for storing a bit of datum, the first double gate cell including a ferroelectric layer and a floating channel layer, wherein a polarity state of the ferroelectric layer affects a resistance of the floating channel layer, the resistance of the floating channel layer corresponding to the bit of datum stored in the first double gate cell; and a second double gate cell selectively turned on by a potential on a selection line to supply a potential of a sense line to the first double gate cell to control read and write operations of the first double gate cell. The present invention also provides methods for operating the nonvolatile ferroelectric memory device.

30 Claims, 17 Drawing Sheets

NONVOLATILE FERROELECTRIC MEMORY DEVICE AND METHOD THEREOF

BACKGROUND

1. Technical Field

The present invention generally relates to a nonvolatile ferroelectric memory device, and more specifically, to a method of obtaining high-speed operations of a nonvolatile ferroelectric memory device with a NOR type cell array using a nano scale Double Gate Cell.

2. Description of the Related Art

FIG. 1 is a cross-sectional diagram illustrating a memory cell of a conventional nonvolatile ferroelectric memory device.

Referring to FIG. 1, a memory cell of the nonvolatile ferroelectric memory device comprises an N-type drain region 4 and a N-type source region 6 which are formed in a p-type substrate 2, and also a ferroelectric layer 8 and a gate word line 10 which are sequentially formed over a channel region.

The above-described conventional nonvolatile ferroelectric memory device writes data by changing polarization of the ferroelectric layer 8, thereby changing a channel resistance, and reads data by measuring the channel resistance. More particularly, when the polarity of the ferroelectric layer 8 induces positive charges to a channel, the channel region has a high resistance. On the other hand, when the polarity of the ferroelectric layer 8 induces negative charges to a channel, the channel region has a low resistance.

However, when the size of the memory cell of the conventional nonvolatile ferroelectric memory device is scaled down, a retention characteristic degrades.

Specifically, in the nonvolatile ferroelectric memory cell having a nano scale level, the retention characteristic becomes weak even by a low voltage stress so that a voltage required to read the memory cell cannot be applied to a word line.

Conventional ferroelectric memory devices have NAND type cell arrays. When a write voltage is applied to an unselected cell in a write mode, data of unselected cells may be destroyed. As a result, it is difficult to perform a random access operation.

SUMMARY

Various embodiments of the present invention are directed at operating a memory cell of a nonvolatile ferroelectric memory device having a nano scale level with a low voltage, and also at obtaining a high-speed chip having a NOR type cell array.

Consistent with the present invention, there is provided a nonvolatile ferroelectric memory device having a plurality of ferroelectric memory cells. The ferroelectric memory cells include a first double gate cell for storing a bit of datum, the first double gate cell including a ferroelectric layer and a floating channel layer, wherein a polarity state of the ferroelectric layer affects a resistance of the floating channel layer, the resistance of the floating channel layer corresponding to the bit of datum stored in the first double gate cell; and a second double gate cell selectively turned on by a potential on a selection line to supply a potential of a sense line to the first double gate cell to control read and write operations of the first double gate cell.

Consistent the present invention, there is provided a nonvolatile ferroelectric memory device having a plurality of ferroelectric memory cells. The ferroelectric memory cells include a double gate cell for storing a bit of datum, the double gate cell including a ferroelectric layer and a floating channel layer, wherein a polarity state of the ferroelectric layer affects a resistance of the floating channel layer, the resistance of the channel layer corresponding to the bit of datum stored in the first double gate cell; and a switch unit selectively turned on by a potential on a selection line to supply a potential of a sense line to the double gate cell so as to control read and write operations of the double gate cell.

Consistent with the present invention, there is provided a nonvolatile ferroelectric memory device having at least one ferroelectric memory cell array. The ferroelectric memory cell array includes a plurality of top word lines; a plurality of bottom word lines; a plurality of selection lines; a plurality of sense lines; a plurality of bit lines; a plurality of sense amplifiers respectively connected to the plurality of bit lines; and a plurality of ferroelectric memory cells connected to the top word lines, the bottom word lines, the selection lines, the sense lines, and the bit lines. Each of the plurality of ferroelectric memory cells includes a first double gate cell for storing a bit of datum, the first double gate cell including a ferroelectric layer and a floating channel layer, wherein a polarity state of the ferroelectric layer affects a resistance of the floating channel layer, the resistance of the channel layer corresponding to the bit of datum stored in the first double gate cell; and a second double gate cell selectively turned on by a potential on a corresponding one of the selection lines to selectively supply a potential of a corresponding one of the sense lines to the first double gate cell so as to control read and write operations of the first double gate cell.

Consistent the present invention, there is provided a nonvolatile ferroelectric memory device having at least one ferroelectric memory cell array. The ferroelectric memory cell array includes a plurality of top word lines; a plurality of bottom word lines; a plurality of selection lines; a plurality of sense lines; a plurality of bit lines; a plurality of sense amplifiers respectively connected to the plurality of bit lines; and a plurality of ferroelectric memory cells connected to the top word lines, the bottom word lines, the selection lines, the sense lines, and the bit lines. Each of the plurality of ferroelectric memory cells includes a double gate cell for storing a bit of datum, the double gate cell including a ferroelectric layer and a floating channel layer, wherein a polarity state of the ferroelectric layer affects a resistance of the floating channel layer, the resistance of the channel layer corresponding to the bit of datum stored in the first double gate cell; and a switch unit selectively turned on by a potential on a corresponding one of the selection lines to selectively supply a potential of a corresponding one of the sense lines to the double gate cell so as to control read and write operations of the double gate cell.

Consistent with the present invention, there is provided a method for operating a nonvolatile ferroelectric memory device having a plurality of ferroelectric memory cells arranged in a plurality of rows and columns, each row corresponding to one of a plurality of top word lines, one of a plurality of bottom word lines, one of a plurality of selection lines, and one of a plurality of sense lines, and each column corresponding to one of a plurality of bit lines, wherein each of the plurality of ferroelectric memory cells comprises a double gate cell for storing a bit of datum and a switch unit selectively turned on by a potential on a corresponding one of the selection lines to supply a potential on a corresponding one of the sense lines to the double gate cell to control read and write operations of the double gate cell. The method includes writing a bit of "1" into each of first ones of the ferroelectric memory cells by applying a positive voltage to the corresponding selection line to turn off the corresponding switch unit, applying a ground voltage to the corresponding bit line and the corresponding bottom word line, and applying a negative polarization transition threshold voltage to the corresponding top word line.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like part.

Figure 1:
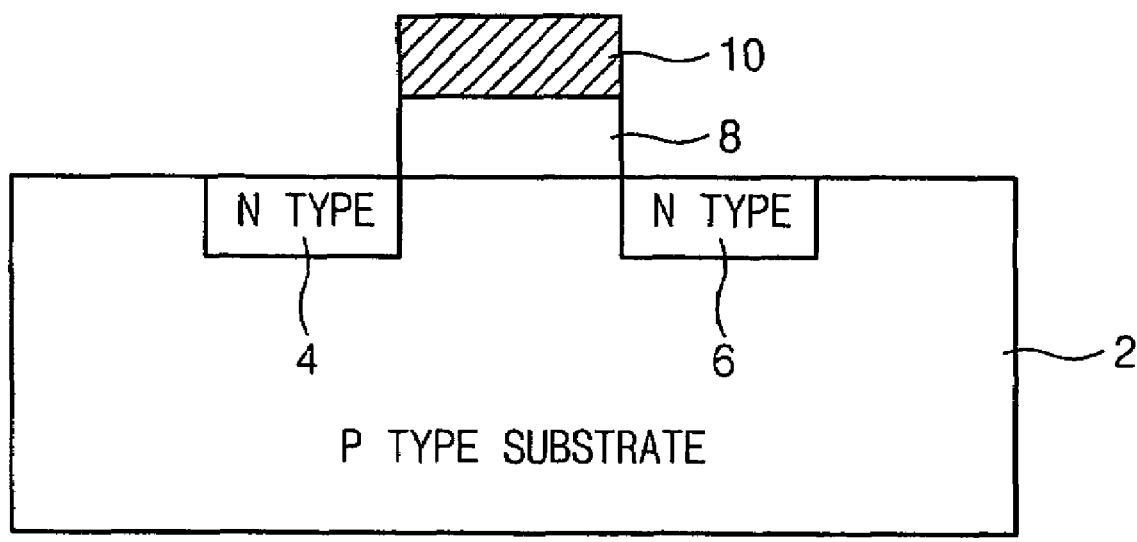
FIG. 1 is a cross-sectional diagram illustrating a memory cell of a conventional nonvolatile ferroelectric memory device.
Figure 2:
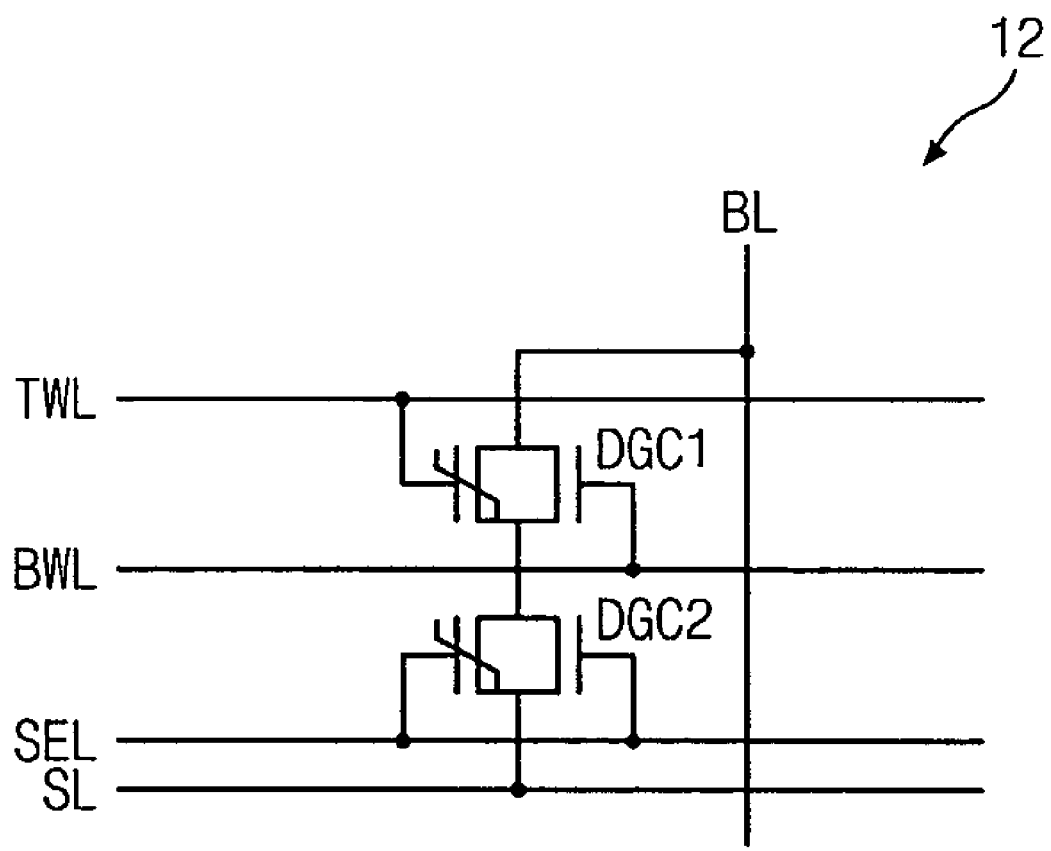
FIG. 2 is a circuit diagram illustrating a unit memory cell of a nonvolatile ferroelectric memory device consistent with the present invention.

FIG. 2 is a circuit diagram illustrating a unit memory cell 12 of a nonvolatile ferroelectric memory device consistent with the present invention.

The unit memory cell 12 includes two double gate cells, a storage double gate cell DGC1 and a switch double gate cell DGC2, which are connected serially between a bit line BL and a sense line SL.

The storage double gate cell DGC1 has a drain connected to the bit line BL, a top electrode connected to a top word line TWL, and a bottom electrode connected to a bottom word line BWL.

The double gate cell DGC2 has a source connected to the sense line SL, a top electrode and a bottom electrode which are connected in common to a selection line SEL.

Figure 3A:
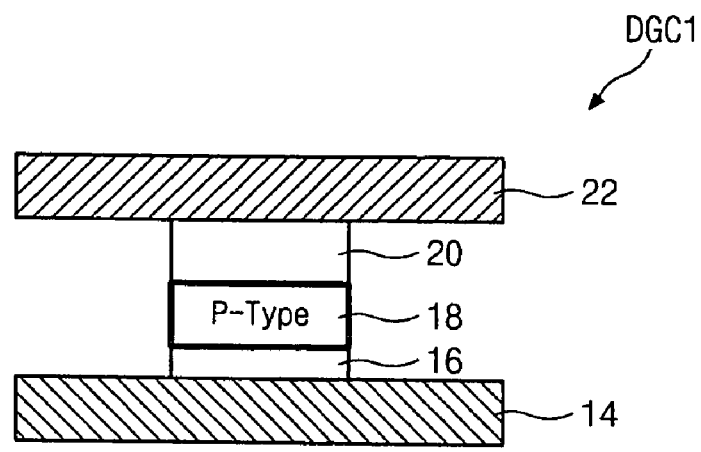
FIGS. 3a and 3b are cross-sectional diagrams illustrating a storage double gate cell of the unit memory cell of FIG. 2.
Figure 3B:
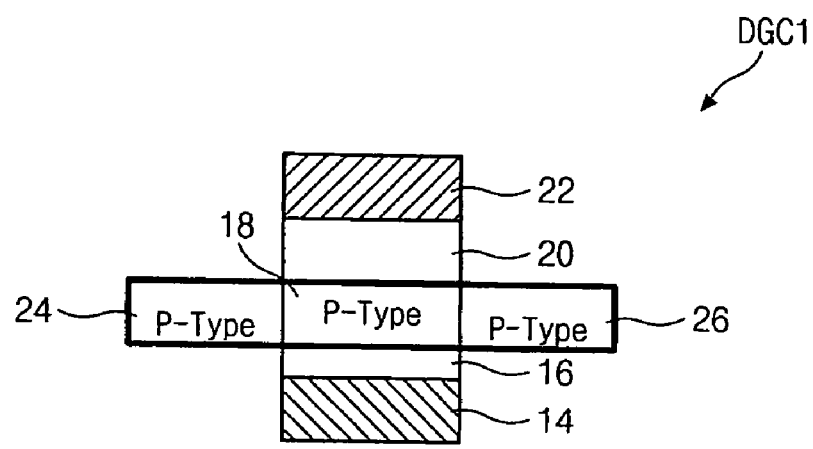

FIGS. 3a and 3b are cross-sectional diagrams illustrating the storage double gate cell DGC1 of the unit memory cell 12 of FIG. 2.

FIG. 3a is a cross-sectional diagram illustrating the storage double gate cell DGC1 cut in a direction parallel to a top word line 22, and FIG. 3b is a cross-sectional diagram illustrating the storage double gate cell DGC1 cut in a direction perpendicular to the top word line 22.

Referring to FIG. 3a, a bottom word line 14, an oxide layer 16, a floating channel layer 18, a ferroelectric layer 20 and a top word line 22 are sequentially formed.

The bottom word line 14 and the top word line 22 are arranged in parallel to each other, and selectively driven by the same row address decoder (not shown).

Referring to FIG. 3b, the storage double gate cell DGC1 further includes a p-type drain region 24 and a p-type source region 26 on the sides of the floating channel layer 18. Preferably, the floating channel layer is formed by one of a carbon nano tube, silicon, germanium Ge, or an organic semiconductor.

In this embodiment, the nonvolatile ferroelectric memory device writes data by modifying a polarization of the ferroelectric layer 20, thereby changing a resistance of the channel layer 18, and reads data by measuring the resistance of the channel layer 18. When the polarity of the ferroelectric layer 20 induces positive charges in the channel layer 18, a channel of positive charges is formed between the p-type drain region 24 and the p-type source region 26. Therefore, the resistance of the channel layer 18 between the p-type drain region 24 and the p-type source region 26 is low. On the other hand, when the polarity of the ferroelectric layer 20 induces negative charges in the channel layer 18, the channel layer 18 has a high resistance between the p-type drain region 24 and the p-type source region 26.

Figure 4A:
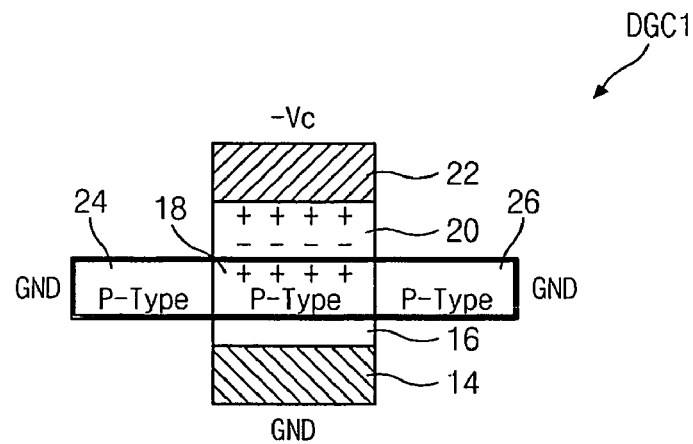
FIGS. 4a through 4c are diagrams illustrating operations for writing and reading a bit of "1" in the storage double gate cell of FIG. 3.
Figure 4B:
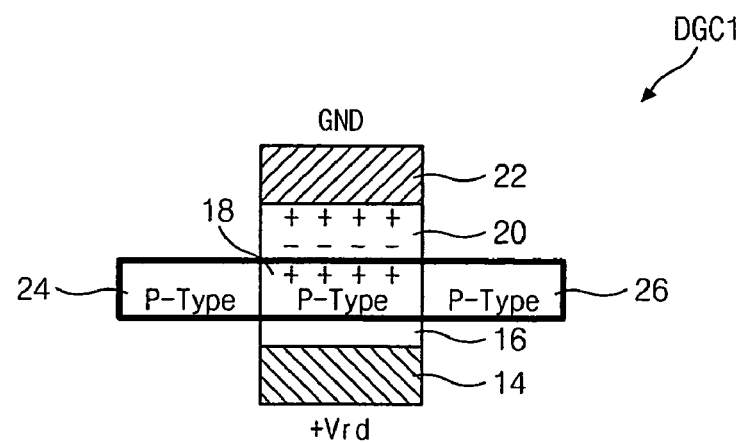
Figure 4C:
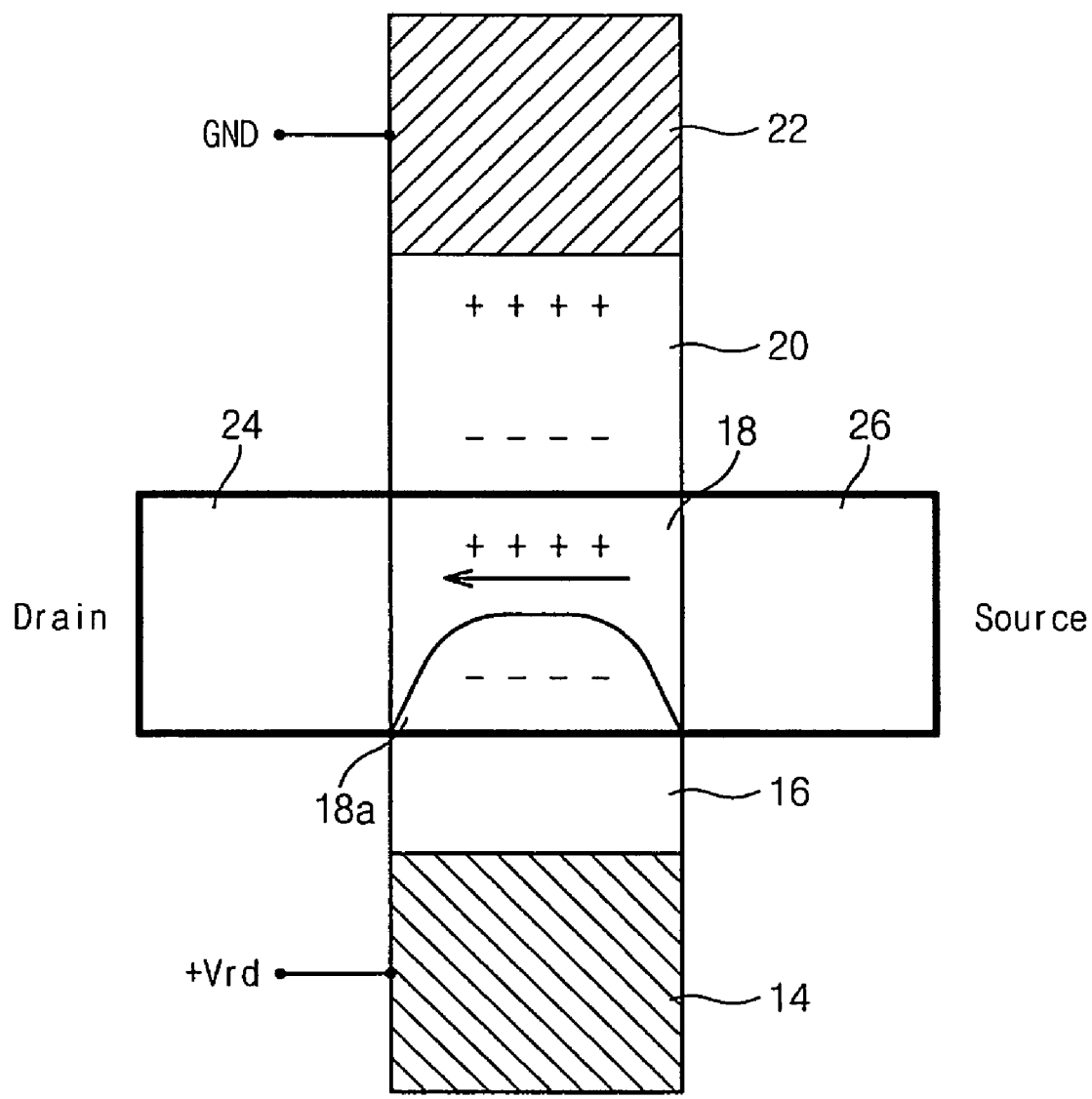

FIGS. 4a through 4c are diagrams illustrating operations for writing and reading a bit of "1" in the storage double gate cell DGC1 of FIG. 3.

FIG. 4a is a diagram illustrating the write operation of the high level data "1".

A ground voltage GND is applied to the bottom word line 14, and a negative polarization transition threshold voltage −Vc is applied to the top word line 22. Here, the drain region 24 and the source region 26 are at ground voltage GND. As a result, a voltage is applied between the channel layer 18 and the ferroelectric layer 20 to form a polarity of the ferroelectric layer 20 so that positive charges may be induced to the top of the channel layer 18, thereby forming a channel. As a result, a bit of "1" is stored in the storage double gate cell DGC1.

FIGS. 4b and 4c are diagrams illustrating the read operation when the storage double gate cell DGC1 has stored a bit of "1".

A ground voltage GND or a read voltage +Vrd having a positive value are applied to the bottom word line 14, and the ground voltage GND is applied to the top word line 22. Here, a depletion region 18a is formed in the bottom of the channel layer 18 by the read voltage +Vrd applied to the bottom word line 14. However, because of the channel formed at the top of the channel layer 18, even when a slight voltage difference is applied between the drain region 26 and the source region 24, a significant amount of current flows through the channel in the channel layer 18. As a result, the bit of "1" stored in the storage double gate cell DGC1 can be read.

Figure 5A:
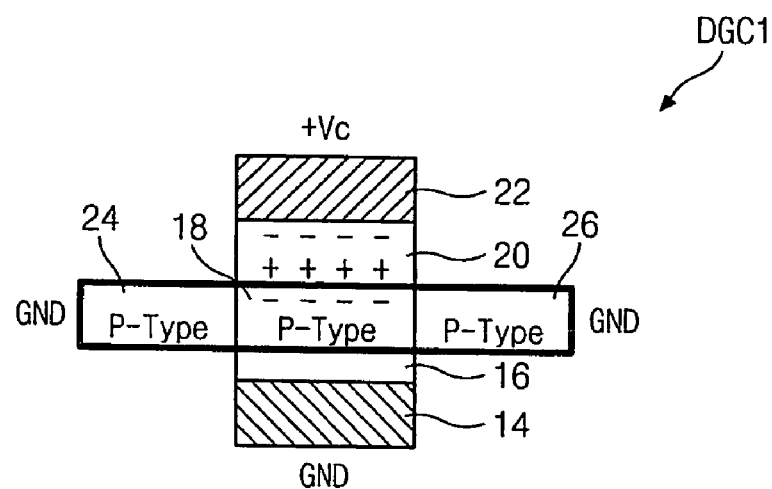
FIGS. 5a through 5c are diagrams illustrating operations for writing and reading a bit of "0" in the storage double gate cell of FIG. 3.
Figure 5B:
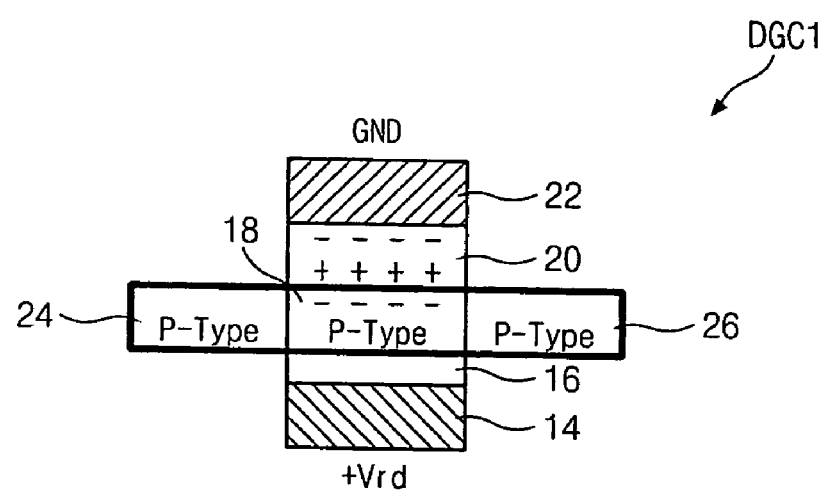
Figure 5C:
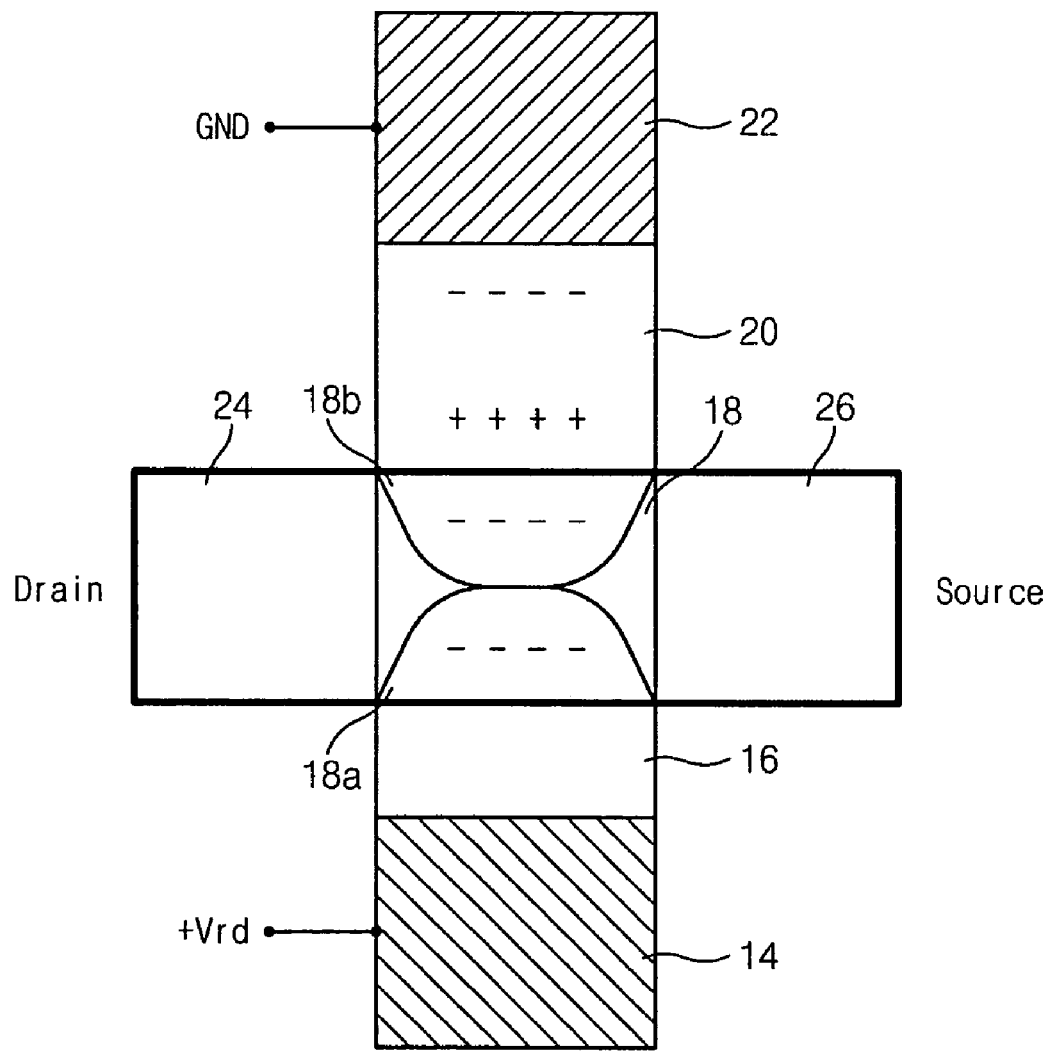

FIGS. 5a through 5c are diagrams illustrating operations for writing and reading a bit of "0" in the storage double gate cell DGC1 of FIG. 2.

FIG. 5a is a diagram illustrating the operation of writing a bit of "0" into the double gate cell DGC1. The ground voltage GND is applied to the bottom word line 14, and a positive polarization transition threshold voltage +Vc is applied to the top word line 22. The drain region 26 and the source region 24 are at ground voltage GND. As a result, a polarity of the ferroelectric layer 20 is formed so that negative charges, i.e., electrons, may be induced to the top of the channel layer 18, thereby forming a depletion region. As a result, a bit of "0" is stored in the storage double gate cell DGC1.

FIGS. 5b and 5c are diagrams illustrating the read operation when the storage double gate cell DGC1 has stored therein a bit of "0".

The ground voltage GND or the read voltage +Vrd having a positive value are applied to the bottom word line 14, and the ground voltage GND is applied to the top word line 22. As a result, a depletion region 18a is formed in the bottom of the channel layer 18 by the read voltage +Vrd applied to the bottom word line 14. FIG. 5c also shows the depletion region, labeled as 18b, formed as a result of the electrons induced to the top of the channel layer 18 by the polarization of the ferroelectric layer 20. As a result of depletion regions 18a and 18b, no channel is formed in the channel layer 18, and a current path between the source region 24 and the drain region 26 is blocked. Thus, when a voltage is applied between the drain region 26 and the source region 24, no current or a small amount of current flows through the channel layer 18. Thus, the bit of "0" stored in the memory cell can be read.

Figure 6A:
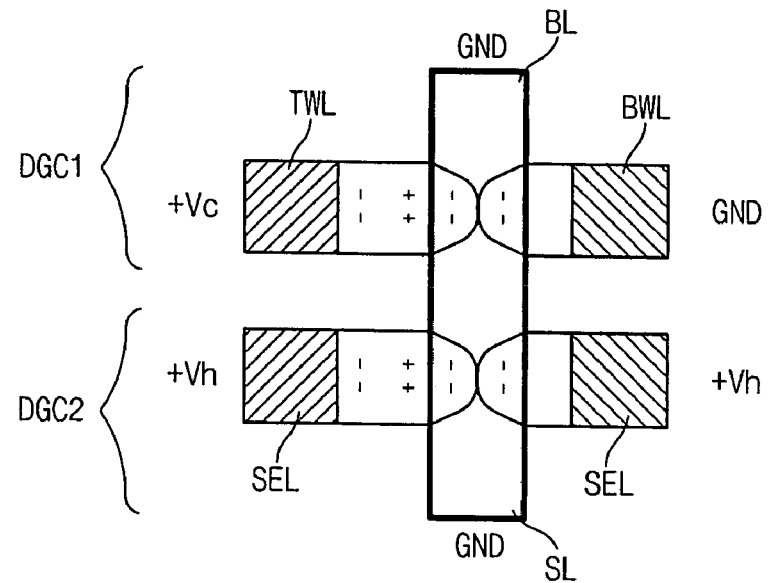
FIGS. 6a and 6b are diagrams illustrating the write operation of the unit memory cell of FIG. 2.
Figure 6B:
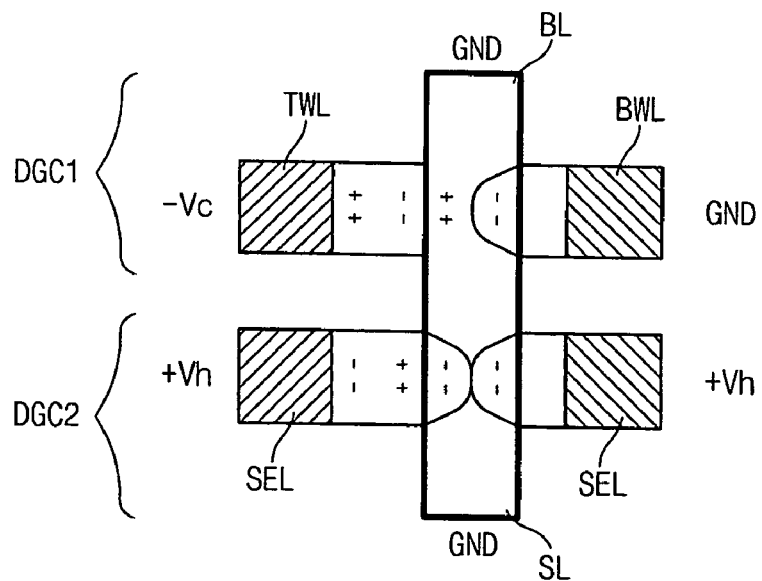

FIGS. 6a and 6b are diagrams illustrating the write operation of the unit memory cell 12 of FIG. 2.

FIG. 6a is a diagram illustrating the operation of writing a bit of "0" into the storage double gate cell DGC1 of the unit memory cell 12.

A high level voltage is applied to the selection line SEL so that the double gate cell DGC2 is turned off. As a result, the storage double gate cell DGC1 is disconnected from the sense line SL.

The positive polarization transition threshold voltage +Vc is applied to the top word line TWL, and the ground voltage GND is applied to the bottom word line BWL and the bit line BL. As a result, the polarity of the ferroelectric layer 20 of the storage double gate DGC1 is such that electrons are induced to the channel layer 18 of the double gate cell DGC1. As a result, a bit of "0" is written into the double gate cell DGC1.

FIG. 6b is a diagram illustrating the operation of writing a bit of "1" into the storage double gate cell DGC1 of the unit memory cell 12.

A high level voltage is applied to the selection line SEL so that the double gate cell DGC2 is turned off. As a result, the storage double gate cell DGC1 is disconnected from the sense line SL.

Here, a negative polarization transition threshold voltage −Vc is applied to the top word line TWL, and the ground voltage GND is applied to the bottom word line BWL and the bit line BL. As a result, the polarity of the ferroelectric layer 20 of the storage double gate cell DGC1 is such that positive charges are induced to the channel layer 18 of the double gate cell DGC1. As a result, a bit of "1" is written into the double gate cell DGC1.

Figure 7A:
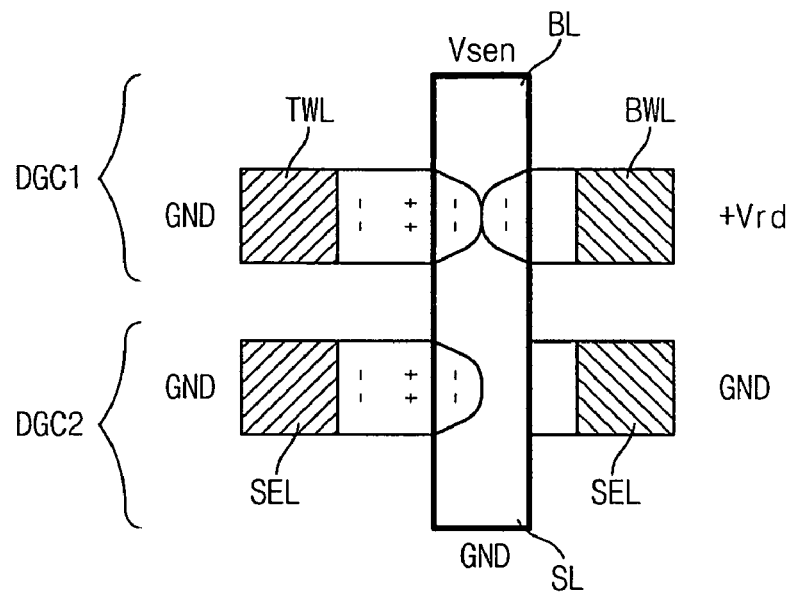
FIGS. 7a and 7b are diagrams illustrating the read operation of the unit memory cell of FIG. 2.
Figure 7B:
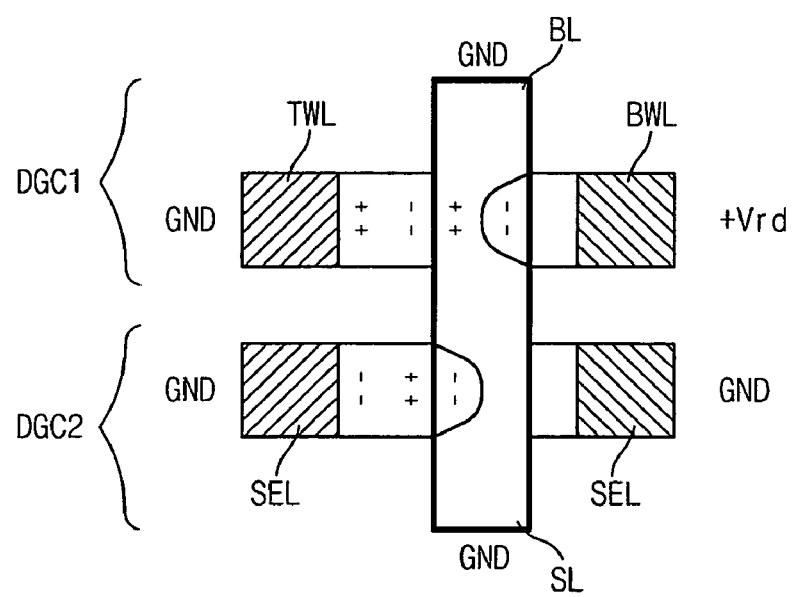

FIGS. 7a and 7b are diagrams illustrating the read operation of the unit memory cell 12 of FIG. 2.

FIG. 7a is a diagram illustrating the read operation of the unit memory cell 12. It is assumed that the unit memory cell 12 has stored in the storage double gate cell DGC1 thereof a bit of "0".

The ground voltage GND is applied to the selection line SEL to turn on the double gate cell DGC2. AS a result, the ground voltage GND applied to the sense line SL is applied to the storage double gate cell DGC1 through the double gate cell DGC2.

Here, the positive read voltage +Vrd is applied to the bottom word line BWL to form a depletion region in the channel layer 18 of the storage double gate cell DGC1 adjacent to the bottom word line BWL. The ground voltage GND is applied to the top word line TWL. Because a bit of "0" is stored in the double gate cell DGC1, i.e., a polarity of the ferroelectric layer 20 of the storage double gate DGC1 is such that electrons are induced in the channel layer 18 of the double gate cell DGC1, a depletion region 18b is formed in the channel layer 18 adjacent to the top word line TWL. As a result, a current path through the channel layer 18 is blocked by the depletion regions 18a and 18b.

Then, when a sense voltage Vsen is applied to the bit line BL to generate a voltage difference between the drain and the source, no current or only a small amount of current flows through the channel layer 18 of the double gate cell DGC1, and it may be determined that a bit of "0" is stored in the unit memory cell 12.

FIG. 7b is a diagram illustrating the read operation of the unit memory cell 12 when a bit of "1" is stored in the double gate cell DGC1. The same voltages are applied to the unit memory cell 12 in FIG. 7B as those shown in FIG. 7a. However, because a bit of "1" is stored in the double gate cell DGC1, i.e., a polarity of the ferroelectric layer 20 of the storage double gate DGC1 is such that positive charges are induced in the channel layer 18 of the double gate cell DGC1, a channel is formed in the channel layer 18 adjacent to the top word line TWL. As a result, when the sense voltage Vsen is applied to the bit line BL to generate a voltage difference between the drain and the source, a significant amount of current flows through the channel layer 18, and the voltage on the bit line BL is pulled down to approximately ground voltage GND. It is therefore determined that a bit of "1" is stored in the storage double gate cell DGC1 of the unit memory cell 12.

Figure 8:
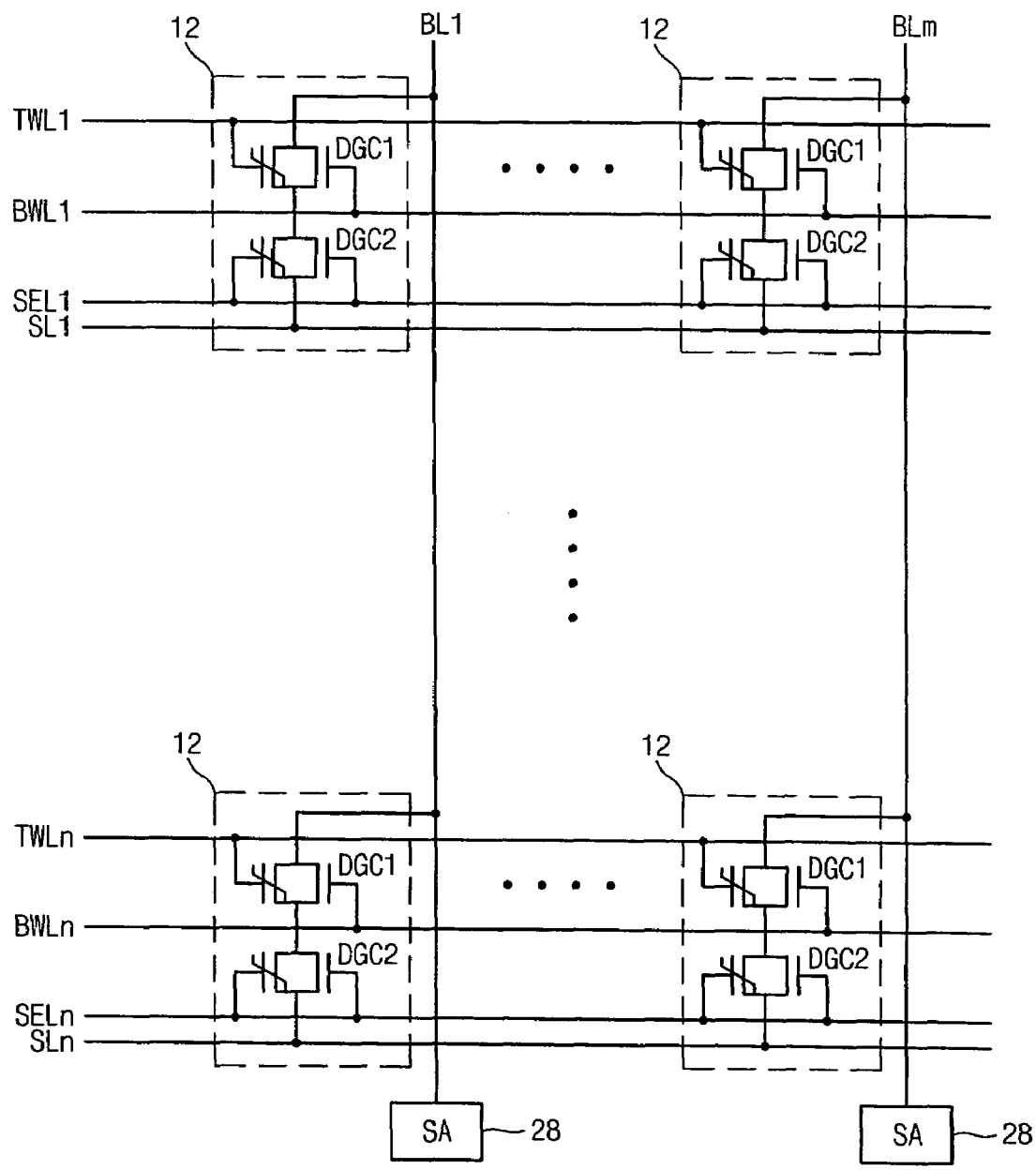
FIG. 8 is a circuit diagram illustrating a memory cell array including a plurality of the unit memory cells of FIG. 2.

FIG. 8 is a circuit diagram illustrating a nonvolatile ferroelectric memory device consistent with the present invention, including a plurality of unit memory cells 12 of FIG. 2 arranged to form a memory cell array. Although FIG. 8 shows only one memory cell array, the memory device may include more than one memory arrays. Particularly, the plurality of unit memory cells 12 are arranged in a matrix type. Each unit memory cell 12 includes the storage double gate cell DGC1 and the switch double gate cell DGC2 as shown in FIG. 2.

The plurality of unit memory cells 12 are connected to a plurality of top word lines, TWL1-TWLn, a plurality of bottom word lines, BWL1~BWLn, a plurality of selection lines, SEL1~SELn, and a plurality of sense lines, SL1~SLn, in a row direction, and connected to a plurality of bit lines, BL1~BLm, in a column direction. A plurality of sense amplifiers 28 are respectively connected to the bit lines BL1~BLm. It is to be understood, however, that rows and columns are only relative terms and may be interchanged without affecting the memory device consistent with the present invention.

Figure 9:
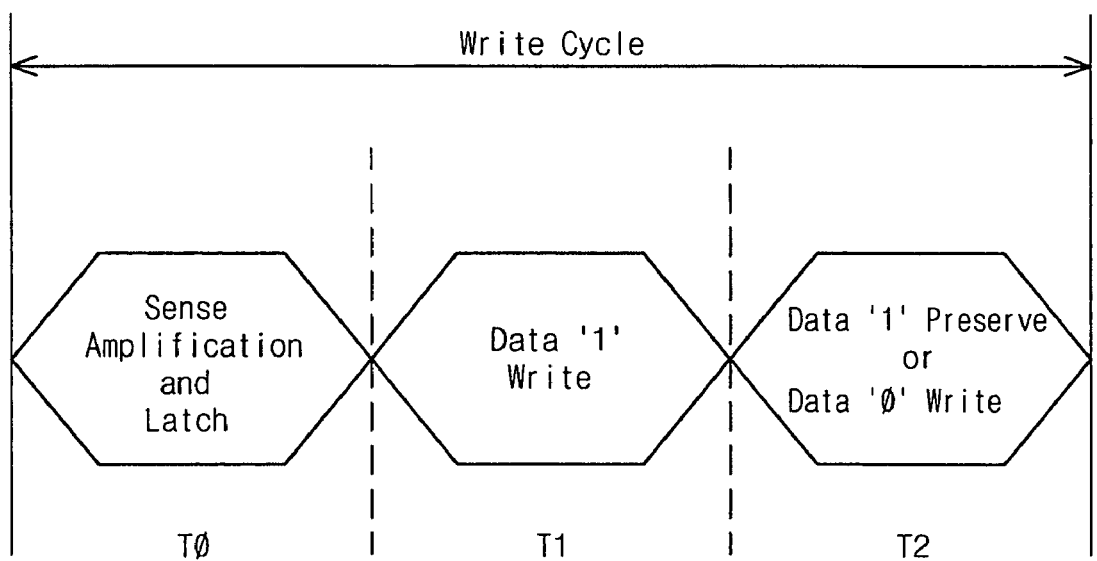
FIG. 9 is a timing diagram illustrating a write cycle of the nonvolatile ferroelectric memory device consistent with the present invention.

FIG. 9 is a timing diagram illustrating a write cycle of the nonvolatile ferroelectric memory device consistent with the present invention.

Referring to FIG. 9, the write cycle includes three operation periods. In the first operation period T0, one of the selection lines SEL1~SELn is selected, and data of all of the unit memory cells 12 connected to the selected selection line are sensed and amplified. In the second operation period T1, bits of "1" are written. In the third operation period T2, the bits of "1" are preserved and bits of "0" are written.

When the bits of "1" written in the second operation period T1 are preserved during the third operation period T2, a voltage having a level of half that of the polarization transition threshold voltage Vc is applied to the corresponding bit line BL for a predetermined time, as will be described below.

Figure 10:
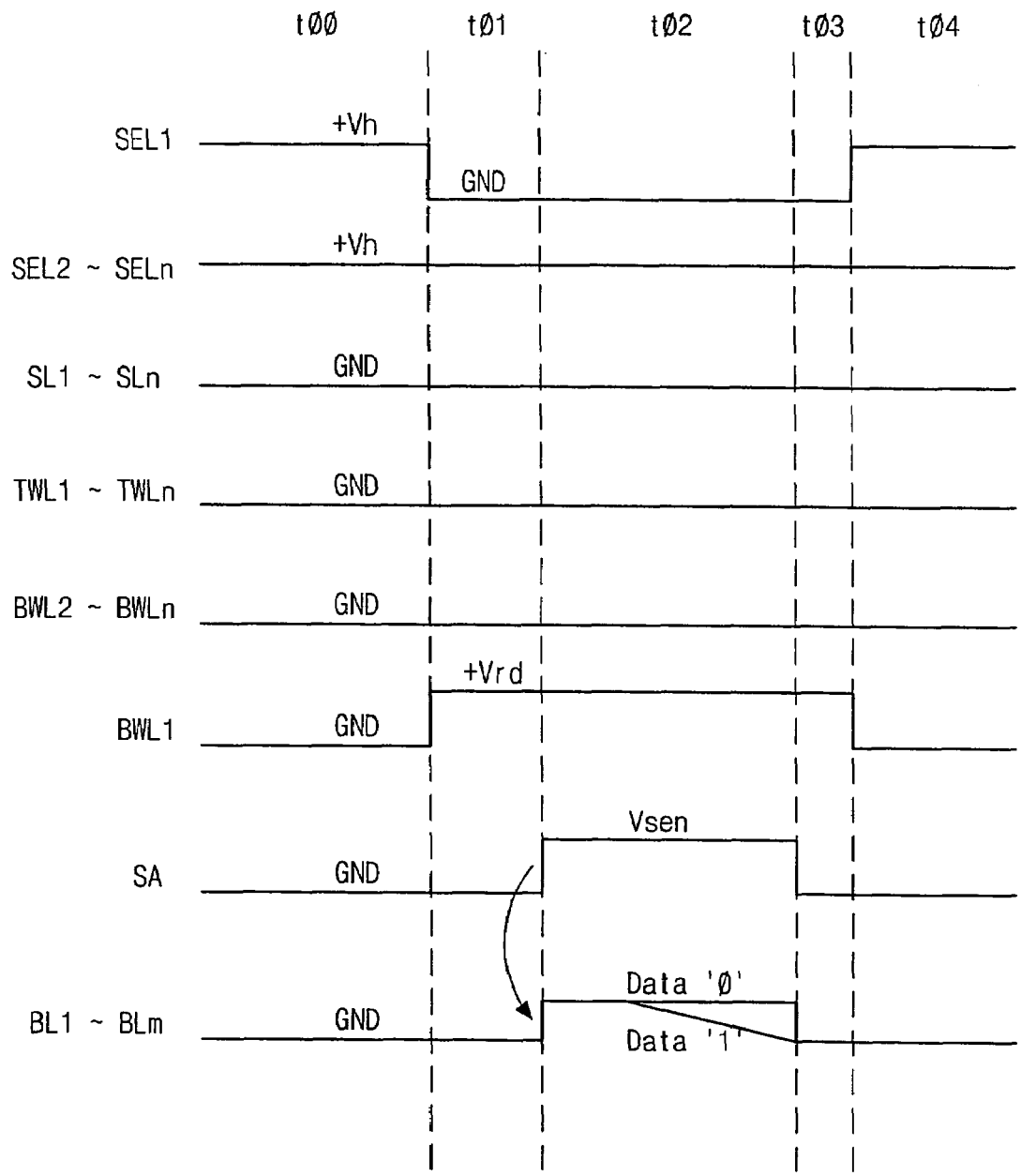
FIG. 10 is a timing diagram illustrating voltage signals during a first operation period of FIG. 9.

FIG. 10 is a timing diagram illustrating voltage signals during the first operation period T0 of FIG. 9. In FIG. 10, it is assumed that the first selection line, SEL1, and the first bottom word line, BWL1, of the memory cell array of FIG. 8 are selected. As FIG. 10 shows, the first operation period T0 is further divided into five sequential time periods, t01-t04. Time periods t01 and t04 are precharge periods, during which a high level voltage +Vh is applied to the selection lines SEL1~SELn, and other lines are grounded.

During time period t01, the selected selection line SEL1 is grounded, the read voltage +Vrd is applied to the selected bottom word line BWL1, and the other lines are grounded. As a result, the current flowing through the bit line BL1 reflects the polarity of the double gate cell DGC1 of and, therefore, the bit of datum stored in the memory unit 12 corresponding to the selected selection line SEL1 and the bit line BL1.

In time period t02, the sense voltage Vsen is applied to the corresponding bit line, BL1, and the current flowing through the bit line BL1 is sensed by the corresponding sense amplifier 28. If the current flowing of the bit line BL1 is low, and the bit line BL1 is maintained at the sense voltage Vsen, then it is determined that a bit of "0" is stored in the double gate cell DGC1. If a significant amount of current, e.g., a current greater than a predetermined current threshold, flows through the bit line BL1, and the potential at the bit line BL1 decreases to approximately the ground voltage GND after a predetermined time, then it is determined that a bit of "1" is stored in the double gate cell DGC1. Thus, by sensing the current through the corresponding bit line, the sense amplifier 28 can sense data stored in the double gate cell DGC1 of the memory units 12. In addition, the sense amplifier 28 also amplifies and latches data stored in the memory units 12.

In time period t03, the ground voltage GND is provided as the sense voltage Vsen at the bit line BL1.

In the period t04, the selected bottom word line BWL1 is grounded, and the selection line SELL is set at the high level voltage +Vh.

Figure 11:
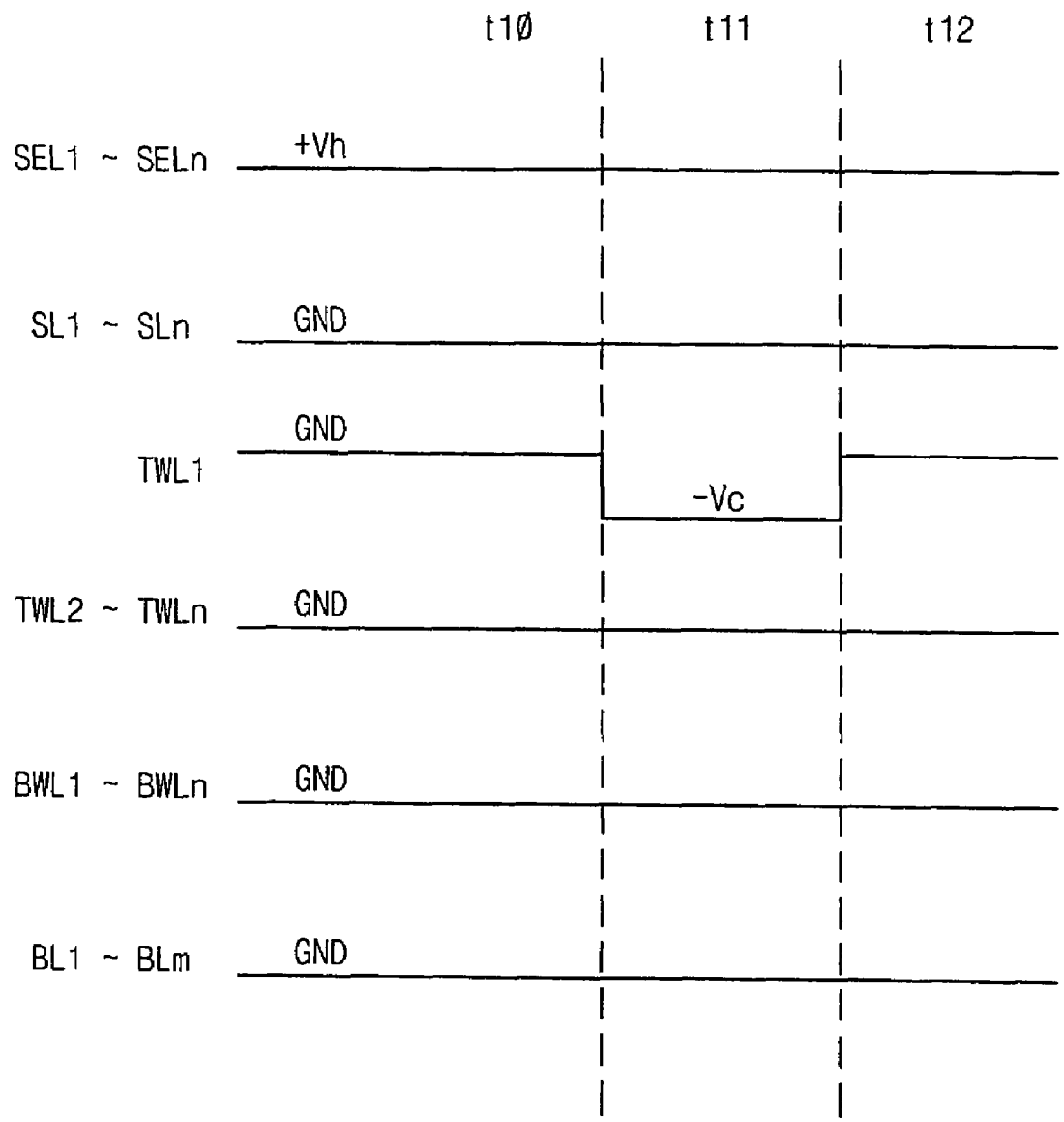
FIG. 11 is a timing diagram illustrating voltage signals during a second operation period of FIG. 9.

FIG. 11 is a timing diagram illustrating voltage signals during the second operation period T1 of FIG. 9. In FIG. 11, it is assumed that the first top word line TWL1 of the memory cell array of FIG. 8 is selected. FIG. 11 shows that the second operation period T1 is further divided into three sequential time periods, t10-t14.

Time periods t10 and t12 are precharge periods, during which the high level voltage +Vh is applied to the selection lines SEL1~SELn, and other lines are grounded.

In time period t11, the negative polarization transition threshold voltage −Vc is applied to the selected top word line TWL1. As a result, a voltage drop across the ferroelectric layer 20 generates a polarity of the ferroelectric layer 20 that induces positive charges in the channel layer 18. As a result, a bit of "1" is stored in the double gate cell DGC1 of the corresponding memory unit 12.

Figure 12:
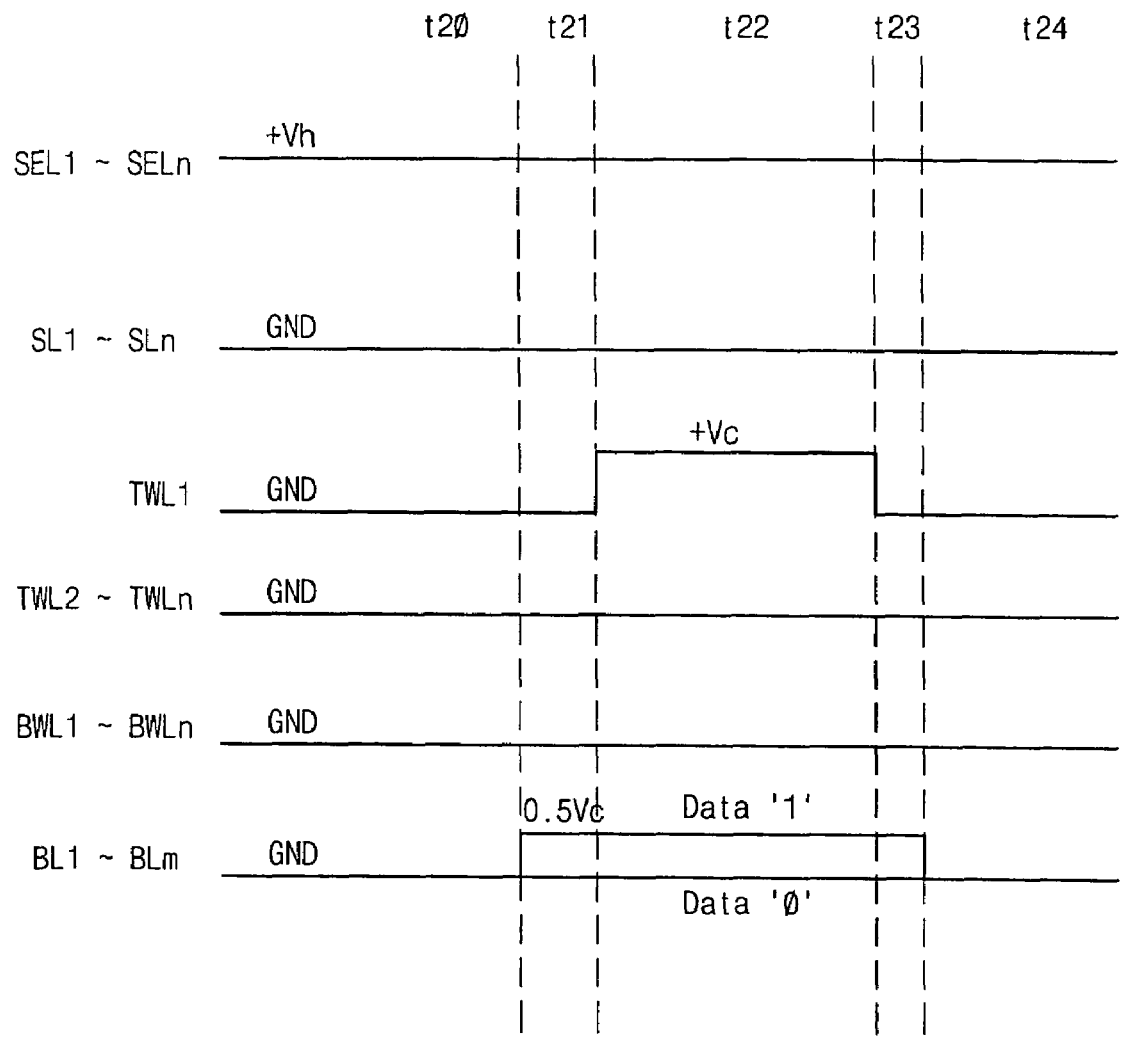
FIG. 12 is a timing diagram illustrating voltage signals during a third operation period of FIG. 9.

FIG. 12 is a timing diagram illustrating voltage signals during the third operation period T2 of FIG. 9. In FIG. 12, it is assumed that the first top word line TWL1 of the memory cell array of FIG. 8 is selected. FIG. 12 shows that the third time period T2 is further divided into five sequential time periods, t20-t24.

Time periods t20 and t24 are precharge periods, during which the high level voltage +Vh is applied to the selection lines SEL1~SELn, and other lines are grounded.

In time period t21, a voltage having a level of half that of the positive polarization threshold voltage Vc is applied to ones of the bit lines which have preserved thereon a bit of "1", and the ground voltage GND is applied to the other ones of the bit lines which have preserved thereon a bit of "0".

In the period t22, the positive polarization threshold voltage +Vc is applied to the selected top word line TWL1 and 0.5Vc as a half value of the positive polarization threshold voltage is applied to the bit line BL1, the high level data "1" are preserved. When the ground voltage GND is applied to the bit line BL1, the low level data "0" are stored.

In the period t23, the selected top word line TWL1 is set as the ground voltage GND again.

Figure 13:
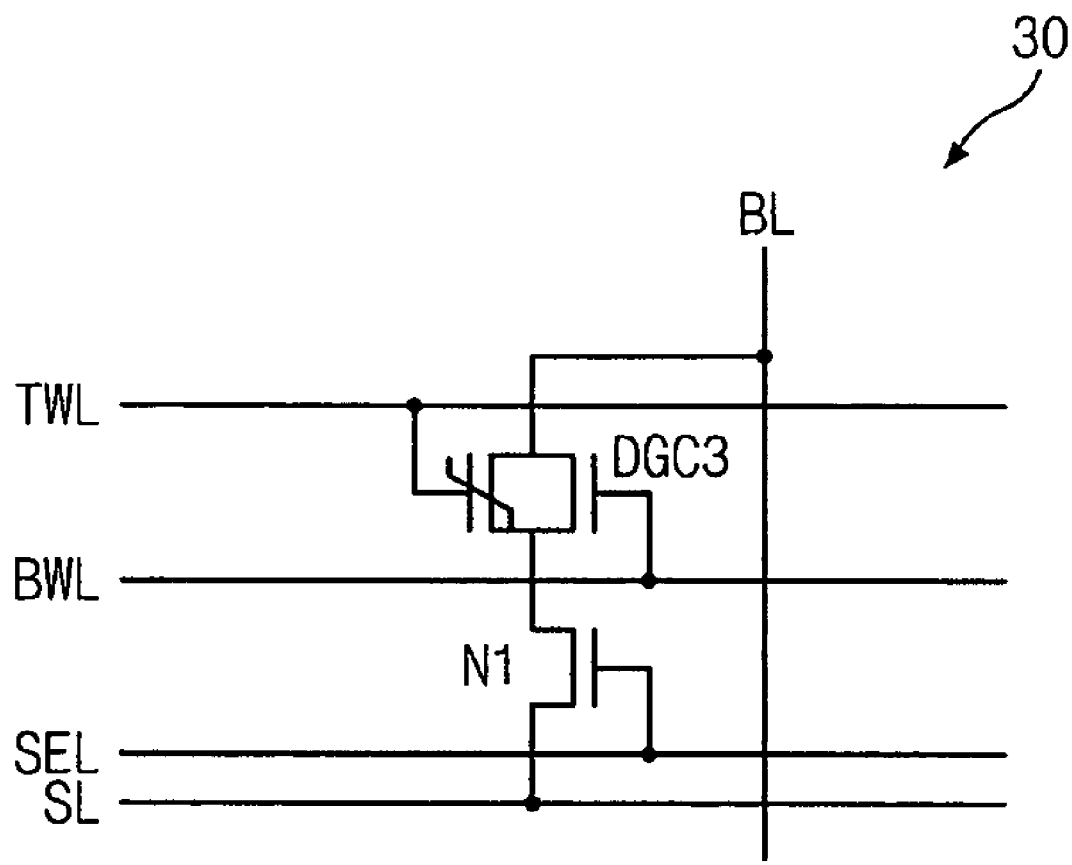
FIG. 13 is a circuit diagram illustrating a unit memory cell of a nonvolatile ferroelectric memory device consistent with the present invention.

FIG. 13 is a circuit diagram illustrating another example of the unit memory cell 30 of a nonvolatile ferroelectric memory device consistent with the present invention.

The unit memory cell 30 includes a double gate cell DGC3 and an NMOS transistor N1 that are connected serially between the bit line BL and the sense line SL.

The double gate cell DGC3 has a drain connected to the bit line BL, a source connected to a drain of the NMOS transistor N1, an upper electrode connected to the top word line TWL, and a lower electrode connected to the bottom word line BWL.

The NMOS transistor N1 has a source connected to the sense line SL, and a gate connected to the selection line SEL.

Figure 14A:
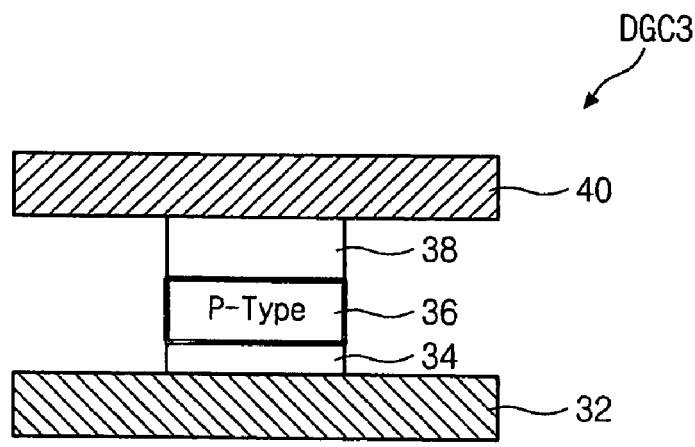
FIGS. 14a and 14b are cross-sectional diagrams illustrating a double gate cell of the unit memory cell of FIG. 13.
Figure 14B:
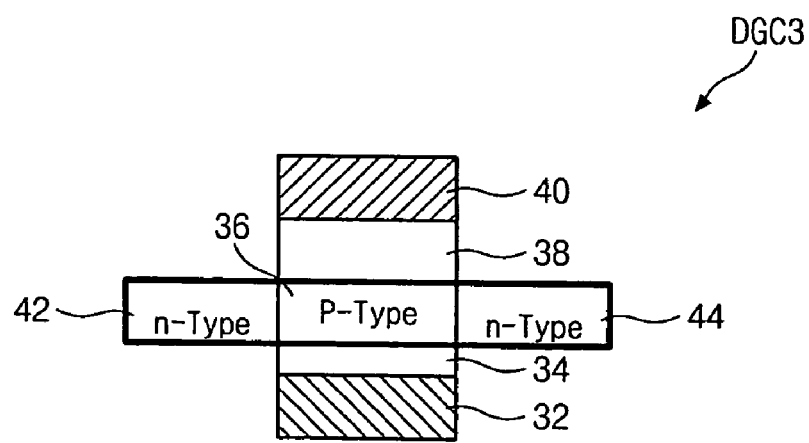

FIGS. 14a and 14b are cross-sectional diagrams illustrating the double gate cell DGC3 of the unit memory cell 30 of FIG. 13.

FIG. 14a is a cross-sectional diagram illustrating the double gate cell DGC3 cut in parallel to the top word line TWL, and FIG. 14b is a cross-sectional diagram illustrating the double gate cell DGC3 cut perpendicular to the top word line TWL.

Referring to FIG. 14a, the bottom word line BWL 32, an oxide layer 34, a floating channel layer 36, a ferroelectric layer 38, and the top word line TWL 40 are sequentially formed. Referring to FIG. 14b, the double gate cell DGC3 further includes an n-type drain region 42 and an n-type source region 44 on the sides of the floating channel layer 36. The floating channel layer 36 is formed by one of a carbon nano tube, silicon, Ge (germanium), or an organic semiconductor. The bottom word line 32 and the top word line 40 are arranged in parallel to each other, and selectively driven by the same row address decoder (not shown).

The unit memory cell shown in FIG. 13 writes data by modifying a polarization state of the ferroelectric layer 38, thereby changing a channel resistance of the floating channel layer 36, and reads data by measuring the resistance of the floating channel layer 36. When the polarity of the ferroelectric layer 38 induces negative charges in the channel layer 36, a channel of negative charges is formed between the n-type drain region 42 and the n-type source region 44, and the resistance of the channel layer 36 between the n-type drain region 42 and the n-type source region 44 is low. On the other hand, when the polarity of the ferroelectric layer 38 induces positive charges to the channel region 36, the resistance of the channel layer 36 is high.

Figure 15:
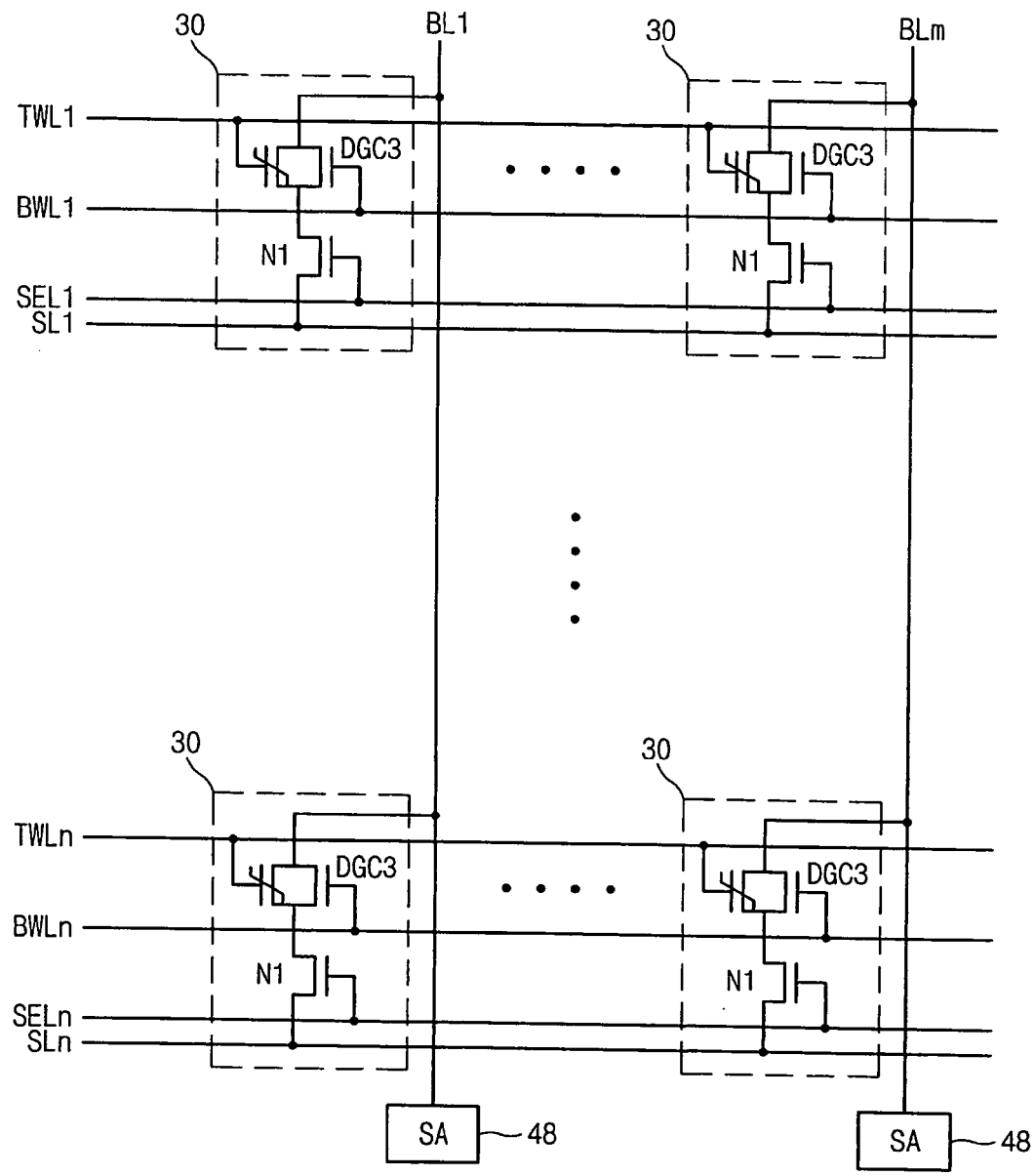
FIG. 15 is a circuit diagram illustrating a memory cell array of a nonvolatile ferroelectric memory device including a plurality of the unit memory cells of FIG. 13.

FIG. 15 is a circuit diagram illustrating a memory cell array of a nonvolatile ferroelectric memory device comprising a plurality of the unit memory cells 30 of FIG. 13.

The memory cell array of FIG. 15 includes a plurality of unit memory cells 30 arranged in a matrix. Here, each unit memory cell 30 includes the double gate cell DGC3 and the NMOS transistor N1.

The plurality of unit memory cells 30 are connected in common to a plurality of top word lines TWL1~TWLn, a plurality of bottom word lines BWL1~BWLn, a plurality of selection lines SEL1~SELn, and a plurality of sense lines SL1~SLn in a row direction, and connected in common to a plurality of bit lines BL1~BLm in a column direction. The plurality of bit lines BL1~BLm are respectively connected to a plurality of sense amplifiers 48. The operations of the memory cell array as shown in FIG. 15 should be apparent to one skilled in the art and are not described herein.

As described above, a nonvolatile ferroelectric memory device consistent with the present invention has a better retention characteristics than conventional nonvolatile ferroelectric memory devices, because an NDRO (non destructive read out) method is applied to read the nonvolatile ferroelectric memory device consistent with the present invention. Also, memory arrays consistent with the present invention are of a NOR type cell array, not of an NAND type, and therefore may operate with high speeds.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile ferroelectric memory device having a plurality of ferroelectric memory cells, the ferroelectric memory cells comprising:
    a first double gate cell for storing a bit of datum, the first double gate cell including a ferroelectric layer and a floating channel layer, wherein a polarity state of the ferroelectric layer affects a resistance of the floating channel layer, the resistance of the floating channel layer corresponding to the bit of datum stored in the first double gate cell; and
    a second double gate cell selectively turned on by a potential on a selection line to supply a potential of a sense line to the floating channel layer of the first double gate cell to control read and write operations of the first double gate cell.

2. A device according to claim 1, wherein the first double gate cell further comprises:
    a bottom word line;
    an insulating layer formed over the bottom word line, wherein the floating channel layer comprises a p-type channel region formed over the insulating layer, and the ferroelectric layer is formed over the floating channel layer;
    a top word line formed over the ferroelectric layer;
    a p-type drain region; and
    a p-type source region, wherein the p-type drain region and the p-type source region are on respective sides of the floating channel layer.

3. A device according to claim 1, wherein the floating channel layer comprises one of a carbon nano tube, silicon, germanium, or an organic semiconductor.

4. The nonvolatile ferroelectric memory device according to claim 1, wherein
    the floating channel layer is operable between first and second resistance conditions, the first resistance condition having a lower resistance than the second resistance condition, and
    the floating channel layer is in the first resistance condition when positive charges are induced therein by a polarization of the ferroelectric layer.

5. The nonvolatile ferroelectric memory device according to claim 1, wherein
    the floating channel layer is operable between first and second resistance conditions, the first resistance condition having a lower resistance than the second resistance condition, and
    the floating channel layer is in the second resistance condition when negative charges are induced therein by a polarization of the ferroelectric layer.

6. A nonvolatile ferroelectric memory device having a plurality of ferroelectric memory cells, the ferroelectric memory cells comprising:
    a double gate cell for storing a bit of datum, the double gate cell including a ferroelectric layer and a floating channel layer, wherein a polarity state of the ferroelectric layer affects a resistance of the floating channel layer, the resistance of the channel layer corresponding to the bit of datum stored in the first double gate cell; and
    a switch unit selectively turned on by a potential on a selection line to supply a potential of a sense line to the floating channel layer of the double gate cell so as to control read and write operations of the double gate cell.

7. The nonvolatile ferroelectric memory device according to claim 6, wherein the double gate cell comprises:
    a bottom word line;
    an insulating layer formed over the bottom word line, wherein the floating channel layer comprises a p-type channel region formed over the insulating layer, and the ferroelectric layer is formed over the floating channel layer;
    a top word line formed over the ferroelectric layer;
    a p-type drain region; and
    a p-type source region, wherein the p-type drain region and the p-type source region are formed on respective sides of the floating channel layer.

8. The nonvolatile ferroelectric memory device according to claim 7, wherein the floating channel layer comprises one of a carbon nano tube, silicon, germanium, or an organic semiconductor.

9. The nonvolatile ferroelectric memory device according to claim 6, wherein
the floating channel layer is operable between first and second resistance conditions, the first resistance condition having a lower resistance than the second resistance condition, and
the floating channel layer is in the first resistance condition when positive charges are induced therein by a polarization of the ferroelectric layer.

10. The nonvolatile ferroelectric memory device according to claim 6, wherein
the floating channel layer is operable between first and second resistance conditions, the first resistance condition having a lower resistance than the second resistance condition, and
the floating channel layer is in the second resistance condition when negative charges are induced therein by a polarization of the ferroelectric layer.

11. The nonvolatile ferroelectric memory device according to claim 6, wherein the switch comprises an MOS transistor.

12. A nonvolatile ferroelectric memory device having at least one ferroelectric memory cell array, the ferroelectric memory cell array comprising:
a plurality of top word lines;
a plurality of bottom word lines;
a plurality of selection lines;
a plurality of sense lines;
a plurality of bit lines;
a plurality of sense amplifiers respectively connected to the plurality of bit lines; and
a plurality of ferroelectric memory cells connected to the top word lines, the bottom word lines, the selection lines, the sense lines, and the bit lines,
wherein each of the plurality of ferroelectric memory cells comprises:
a first double gate cell for storing a bit of datum, the first double gate cell including a ferroelectric layer and a floating channel layer, wherein a polarity state of the ferroelectric layer affects a resistance of the floating channel layer, the resistance of the channel layer corresponding to the bit of datum stored in the first double gate cell; and
a second double gate cell selectively turned on by a potential on a corresponding one of the selection lines to selectively supply a potential of a corresponding one of the sense lines to the first double gate cell so as to control read and write operations of the first double gate cell.

13. The nonvolatile ferroelectric memory device according to claim 12, wherein the first double gate cell further comprises:
an insulating layer formed over a corresponding one of the bottom word lines, wherein the floating channel layer comprises a p-type channel region formed over the insulating layer, the ferroelectric layer is formed over the floating channel layer, and a corresponding one of the top word lines is formed over the ferroelectric layer;
a p-type drain region; and
a p-type source region, wherein the p-type drain region and the p-type source region are formed on respective sides of the floating channel layer.

14. The nonvolatile ferroelectric memory device according to claim 12, wherein the floating channel layer comprises one of a carbon nano tube, silicon, germanium, or an organic semiconductor.

15. The nonvolatile ferroelectric memory device according to claim 12, wherein
the floating channel layer is operable between first and second resistance conditions, the first resistance condition having a lower resistance than the second resistance condition, and
the floating channel layer is in the first resistance condition when positive charges are induced therein by a polarization of the ferroelectric layer.

16. The nonvolatile ferroelectric memory device according to claim 12, wherein
the floating channel layer is operable between first and second resistance conditions, the first resistance condition having a lower resistance than the second resistance condition, and
the floating channel layer is in the second resistance condition when negative charges are induced therein by a polarization of the ferroelectric layer.

17. A nonvolatile ferroelectric memory device having at least one ferroelectric memory cell array, the ferroelectric memory cell array comprising:
a plurality of top word lines;
a plurality of bottom word lines;
a plurality of selection lines;
a plurality of sense lines;
a plurality of bit lines;
a plurality of sense amplifiers respectively connected to the plurality of bit lines; and
a plurality of ferroelectric memory cells connected to the top word lines, the bottom word lines, the selection lines, the sense lines, and the bit lines,
wherein each of the plurality of ferroelectric memory cells comprises:
a double gate cell for storing a bit of datum, the double gate cell including a ferroelectric layer and a floating channel layer, wherein a polarity state of the ferroelectric layer affects a resistance of the floating channel layer, the resistance of the channel layer corresponding to the bit of datum stored in the first double gate cell; and
a switch unit selectively turned on by a potential on a corresponding one of the selection lines to selectively supply a potential of a corresponding one of the sense lines to the double gate cell so as to control read and write operations of the double gate cell.

18. The nonvolatile ferroelectric memory device according to claim 17, wherein the double gate cell comprises:
an insulating layer formed over a corresponding one of the bottom word lines, wherein the floating channel layer comprises a p-type channel region formed over the insulating layer, the ferroelectric layer is formed over the floating channel layer, and a corresponding one of the top word lines is formed over the ferroelectric layer;
a p-type drain region; and
a p-type source region, wherein the p-type drain region and the p-type source region are formed on respective sides of the floating channel layer.

19. The nonvolatile ferroelectric memory device according to claim 17, wherein the floating channel layer comprises one of a carbon nano tube, silicon, germanium, or an organic semiconductor.

20. The nonvolatile ferroelectric memory device according to claim 17, wherein
the floating channel layer is operable between first and second resistance conditions, the first resistance condition having a lower resistance than the second resistance condition, and
the floating channel layer is in the first resistance condition when positive charges are induced therein by a polarization of the ferroelectric layer.

21. The nonvolatile ferroelectric memory device according to claim 17, wherein
the floating channel layer is operable between first and second resistance conditions, the first resistance condition having a lower resistance than the second resistance condition, and
the floating channel layer is in the second resistance condition when negative charges are induced therein by a polarization of the ferroelectric layer.

22. A method for operating a nonvolatile ferroelectric memory device having a plurality of ferroelectric memory cells arranged in a plurality of rows and columns, each row corresponding to one of a plurality of top word lines, one of a plurality of bottom word lines, one of a plurality of selection lines, and one of a plurality of sense lines, and each column corresponding to one of a plurality of bit lines, wherein each of the plurality of ferroelectric memory cells comprises a double gate cell for storing a bit of datum and a switch unit selectively turned on by a potential on a corresponding one of the selection lines to supply a potential on a corresponding one of the sense lines to the double gate cell to control read and write operations of the double gate cell, the method comprising:
writing a bit of "1" into each of first ones of the ferroelectric memory cells by
applying a positive voltage to the corresponding selection line to turn off the corresponding switch unit,
applying a ground voltage to the corresponding bit line and the corresponding bottom word line, and
applying a negative polarization transition threshold voltage to the corresponding top word line.

23. The method according to claim 22, wherein each of the double gate cells of the ferroelectric memory cells includes a ferroelectric layer and a floating channel layer, wherein a polarity state of the ferroelectric layer affects a resistance of the floating channel layer, the resistance of the channel layer corresponding to a bit of datum stored in the first double gate cell, and
wherein writing a bit of "1" into each of the first ones of the ferroelectric memory cells comprises setting a polarization of the ferroelectric layers of the double gate cells of the first ones of the ferroelectric memory cells to induce positive charges in the corresponding floating channel layers.

24. The method according to claim 22, further comprising:
maintaining data stored in second ones of the ferroelectric memory cells by
applying a positive voltage to the corresponding selection lines,
applying a ground voltage to the corresponding bottom word lines,
applying a positive polarization transition threshold voltage to the corresponding top word lines, and
applying a voltage having a level of half that of the positive polarization transition threshold voltage to the corresponding bit lines.

25. The method according to claim 24, further comprising:
writing a bit of "0" into each of third ones of the ferroelectric memory cells by applying a positive voltage to the corresponding selection lines,
applying a ground voltage to the corresponding bottom word lines, applying a positive polarization transition threshold voltage to the corresponding top word lines, and
applying the ground voltage to the corresponding bit lines.

26. The method according to claim 25, wherein each of the double gate cells of the ferroelectric memory cells includes a ferroelectric layer and a floating channel layer, wherein a polarity state of the ferroelectric layer affects a resistance of the floating channel layer, the resistance of the channel layer corresponding to the bit of datum stored in the first double gate cell, and
wherein writing a bit of "0" into each of the third ones of the ferroelectric memory cells comprises setting a polarization of the ferroelectric layers of the double gate cells of the third ones of the ferroelectric memory cells to induce negative charges in the corresponding floating channel layers.

27. The method according to claim 25, wherein maintaining data stored in the second ones of the ferroelectric memory cells and writing a bit of "0" into each of the third ones of the ferroelectric memory cells are performed simultaneously.

28. The method according to claim 22, further comprising:
reading data stored in selected ones of the ferroelectric memory cells by
applying a ground voltage to the corresponding selection lines and the corresponding top word lines,
applying a positive read voltage to the corresponding bottom word lines, and
applying a sense voltage to the corresponding bit lines.

29. The method according to claim 22, wherein the switch unit comprises another double gate cell.

30. The method according to claim 22, wherein the switch unit comprises an MOS transistor.

* * * * *